United States Patent
Payan et al.

(10) Patent No.: US 11,081,607 B2
(45) Date of Patent: Aug. 3, 2021

(54) SOLAR PANEL COMPRISING NOTABLY A STRUCTURE AND AT LEAST TWO PHOTOVOLTAIC CELLS

(71) Applicants: CENTRE NATIONAL D'ETUDES SPATIALES, Paris (FR); OFFICE NATIONAL D'ETUDES ET DE RECHERCHES AÉROSPATIALES, Palaiseau (FR)

(72) Inventors: Denis Payan, Mervilla (FR); Virginie Inguimbert, Montesquieu-Lauragais (FR); Jean-Michel Siguier, Quint-Fonsegrives (FR)

(73) Assignees: CENTRE NATIONAL D'ETUDES SPATIALES, Paris (FR); OFFICE NATIONAL D'ETUDES ET DE RECHERCHES AEROSPATIALES, Palaiseau (FR)

( * ) Notice: Subject to any disclaimer, the term of this patent is extended or adjusted under 35 U.S.C. 154(b) by 489 days.

(21) Appl. No.: 15/996,847

(22) Filed: Jun. 4, 2018

(65) Prior Publication Data

US 2018/0358496 A1 Dec. 13, 2018

(30) Foreign Application Priority Data

Jun. 8, 2017 (FR) .................................. FR1755121

(51) Int. Cl.
*H01L 31/0224* (2006.01)
*B64G 1/44* (2006.01)
(Continued)

(52) U.S. Cl.
CPC .......... *H01L 31/0481* (2013.01); *B64G 1/443* (2013.01); *H01L 31/022433* (2013.01);
(Continued)

(58) Field of Classification Search
CPC ............. H01L 31/0504; H01L 31/0481; H01L 31/022433; B64G 1/443
See application file for complete search history.

(56) References Cited

U.S. PATENT DOCUMENTS 4,574,160 A * 3/1986 Cull .................... H01L 31/0508
136/245
6,091,017 A * 7/2000 Stern ................... G02B 19/0042
126/698
(Continued)

FOREIGN PATENT DOCUMENTS

EP 1326287 A1 7/2003

OTHER PUBLICATIONS

Hosoda, et al., "Development of 400 V Solar Array Technology for Low Earth Orbit Plasma Environment", IEEE Transactions on Plasma Science, IEEE Service Center, Piscataway, NJ, US, vol. 34, No. 5, pp. 1986-1996, Oct. 1, 2006.
(Continued)

*Primary Examiner* — Brian M O'Hara
(74) *Attorney, Agent, or Firm* — Burris Law, PLLC (57) ABSTRACT

This solar panel includes a structure in contact with an ambient environment and at least two photovoltaic cells each defining a lateral contact face and including a base element, a grid of electric conductors and a protective element made from transparent material, the grid including at least one conductive wire extending along the lateral contact face. The two cells are arranged on the structure such that at least part of each of the lateral contact faces is arranged regarding the other part while forming a panel surface and such that the shortest path passing through the ambient environment between the opposite parts of the lateral faces of the two cells is equal to at least about 20 mm.

15 Claims, 5 Drawing Sheets

(51) Int. Cl.
  *H01L 31/048*  (2014.01)
  *H01L 31/05*  (2014.01)
  *H02S 99/00*  (2014.01)
  *H01L 31/054*  (2014.01)
  *H01L 31/042*  (2014.01)
  *H01L 31/0445*  (2014.01)

(52) U.S. Cl.
  CPC ........ *H01L 31/042* (2013.01); *H01L 31/0445* (2014.12); *H01L 31/0504* (2013.01); *H01L 31/0547* (2014.12); *H02S 99/00* (2013.01)

(56) References Cited

U.S. PATENT DOCUMENTS

| | | | |
|---|---|---|---|
| 6,188,012 B1 | 2/2001 | Ralph | |
| 7,339,108 B2* | 3/2008 | Tur | H01L 31/0547 |
| | | | 136/244 |
| 7,432,438 B2* | 10/2008 | Rubin | H01L 31/022425 |
| | | | 136/244 |
| 8,198,117 B2* | 6/2012 | Leidholm | B82Y 10/00 |
| | | | 438/57 |
| 8,828,778 B2* | 9/2014 | Meyer | H01L 31/05 |
| | | | 438/66 |
| 10,069,019 B2* | 9/2018 | Zhao | H01L 31/02008 |
| 2003/0155003 A1 | 8/2003 | Tur et al. | |

OTHER PUBLICATIONS

French Search Report issued in connection with French Application No. FR 1755121, dated Apr. 11, 2018, 3 pages.

* cited by examiner

SOLAR PANEL COMPRISING NOTABLY A STRUCTURE AND AT LEAST TWO PHOTOVOLTAIC CELLS

FIELD OF THE INVENTION

The present invention relates to a solar panel in particular including a structure and at least two photovoltaic cells.

The invention is in particular applicable in the aerospace domain. Thus, the solar panel according to the invention is on board a spacecraft such as a satellite, for example, and is an electrical power source for such a vehicle.

BACKGROUND OF THE INVENTION

In general, the satellite includes one or several solar panels, also called solar generators, which are used to power at least some electrical components of the satellite.

The modern structures of satellites are based on the "all electrical" concept, consisting of using propulsion of the on-board electrical propellant type. There is then a need to increase the capacities of solar generators to produce electrical energy.

In this context, solar generators must provide voltages of up to several hundred volts (typically 350 V for the current propellants, or even 600 V for some motors being studied).

It is also known that the electrical components of satellites, and in particular electrical current conductors used in these components, are particularly exposed to short circuit or breaking risks (open circuit) if an electric arc appears.

Indeed, in an aerospace environment with no atmosphere, a precursor phenomenon of the electrostatic discharge, micrometeorite impact, high-voltage, etc. type may generate local plasma. The latter, by expanding, makes the environment conductive and may establish a short circuit between differentially polarized parts. Such a short circuit is also known as an electric arc.

The problem of the establishment of electric arcs becomes particularly relevant in light of solar generators due to the available photovoltaic power.

In particular, means for preventing the establishment of electric arcs used in the current structures are no longer sufficient to perform this role effectively. This is in particular due to the required increase in the voltage of the electric current provided by these generators.

Thus, it has been noted that when the electric voltage generated by these solar generators become significant, electric arcs appear temporarily, quasi-permanently or permanently between different conductors of these generators.

One can then see that these arcs can greatly damage the solar panels and cause losses of the available photovoltaic power partially (damage of a cell, a row or an entire section), damage of an entire panel or the entire wing of the solar generator).

SUMMARY OF THE INVENTION

The present invention aims to propose a solar panel in which the risk of establishment of an electric arc is greatly decreased.

To that end, the invention relates to a solar panel including a structure in contact with an ambient environment; at least two photovoltaic cells, each cell defining a lateral contact face and including a base element, a grid of electric conductors and a protective element made from transparent material, the grid being arranged between the protective element and the base element and including at least one conductive wire extending along the lateral contact face of the cell; the two cells being arranged on the structure such that at least part of each of the lateral contact faces is arranged regarding the other part (e.g., facing each other) and such that the protective elements of these cells form a panel surface; and the solar panel being characterized in that the cells are arranged such that the shortest path running through the ambient environment between the facing parts of the lateral faces of the two cells is equal to at least about 20 mm.

According to other advantageous aspects of the invention, the panel comprises one or more of the following features, considered alone or according to all technically possible combinations:

it further includes a barrier made from dielectric material arranged on the structure between the lateral contact faces of the two photovoltaic cells, extending along the opposite parts of these faces and protruding relative to the panel surface, the shortest path between the opposite parts of the lateral faces being calculated by bypassing the barrier;

it is designed to operate in an environment in which the direction perpendicular to the panel surface moves away from a lighting direction by a maximum separation angle smaller than 90°, the lighting direction being defined by a straight line passing through the center of a lighting source and a predetermined point of the panel;

the barrier and/or the cells are arranged such that the shade generated by the barrier when the direction perpendicular to the panel surface moves away from the lighting direction of the maximum separation angle, is substantially outside each of the two cells;

it is on-board a spacecraft;

the barrier protrudes relative to the panel surface by at least about 10 mm;

the opposite parts of the two cells are separated by at least about 9 mm;

the cross-section of the barrier forms an isosceles triangle, the base of which is adjacent to the structure, the angle opposite the base being twice the maximum separation angle;

the structure has an elongated shape along a longitudinal axis perpendicular to a transverse axis;

the grid of each cell includes a plurality of conductive wires extending along the longitudinal axis;

the grid of each cell assumes the form of a comb, the teeth of which are formed by conductive wires extending along the longitudinal axis;

it is on-board a spacecraft rotating around an orbit;

the longitudinal axis is perpendicular to the plane comprising the orbit;

the barrier is made from a flexible material, the barrier being suitable for being folded in the space delimited by the two lateral contact faces without protruding relative to the panel surface;

the barrier is made from a polyimide polymer;

the barrier is a concentrator; and the barrier is arranged between each pair of photovoltaic cells between which the voltage is greater than 30 V.

BRIEF DESCRIPTION OF THE DRAWINGS

These features and advantages of the invention will appear upon reading the following description, provided solely as a non-limiting example, and done in reference to the appended drawings, in which.

DETAILED DESCRIPTION OF THE INVENTION

In the description, when the term "about" is used in relation with a numerical value, it must be understood that the given numerical value is approximate with a margin of error that is determined by one skilled in the art in each considered case. As an example, this margin of error is equal to +10% or −10% of the given value.

Figure 1:
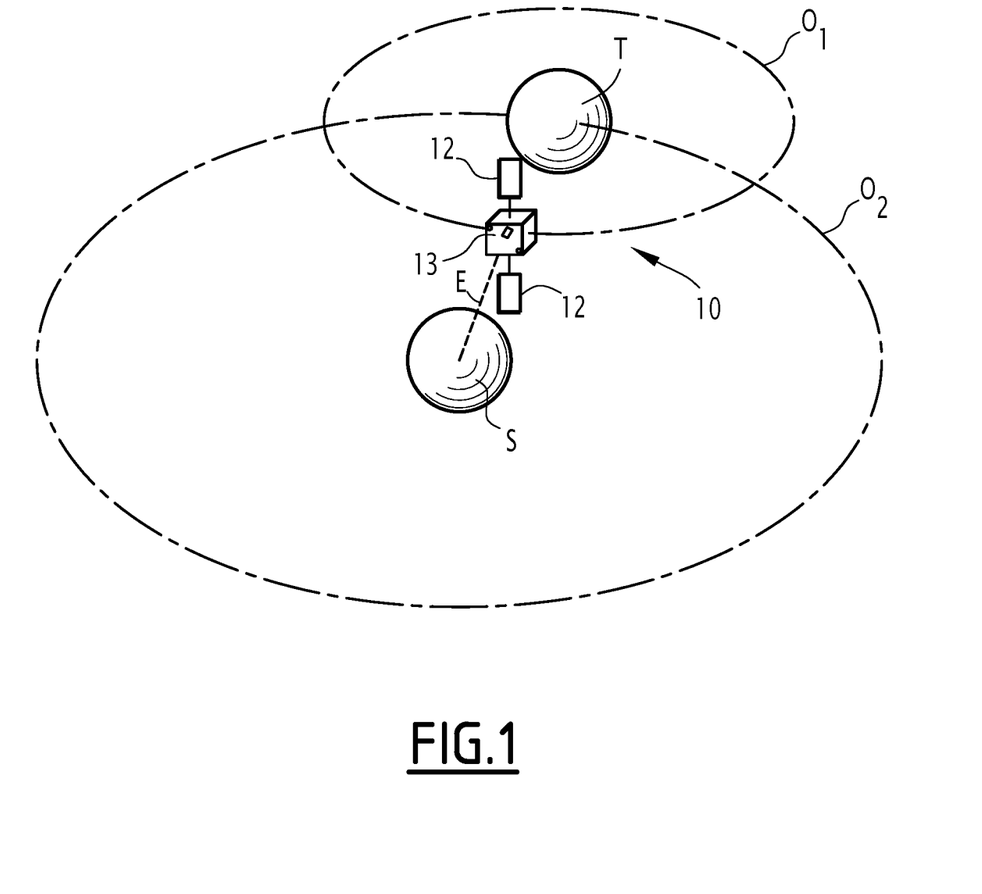
FIG. 1 is a schematic view of a geostationary satellite in particular including a solar panel according to a first embodiment of the invention.

In FIG. 1, the geostationary satellite 10 includes two solar panels 12 and 12' according to the invention arranged on either side of a body 13 of the satellite 10 in a manner known in itself.

The satellite 10 rotates around the Earth T following an orbit $O_1$. The Earth then rotates around the Sun following an orbit $O_2$. The line E passing through the center of the Sun S and a fixed point of the panel 12 and oriented toward the satellite 10 will be denoted hereinafter using the term "lighting direction E".

The solar panels 12, 12' are able to produce an electric current delivering the power of several kilowatts. The voltage of this current for example extends from 28 V to 160 V, or up to 350 V or more.

The solar panels 12, 12' are substantially identical to one another. Thus, hereinafter, only the solar panel 12 will be explained in detail in particular in reference to FIGS. 2 and 3.

Figure 2:
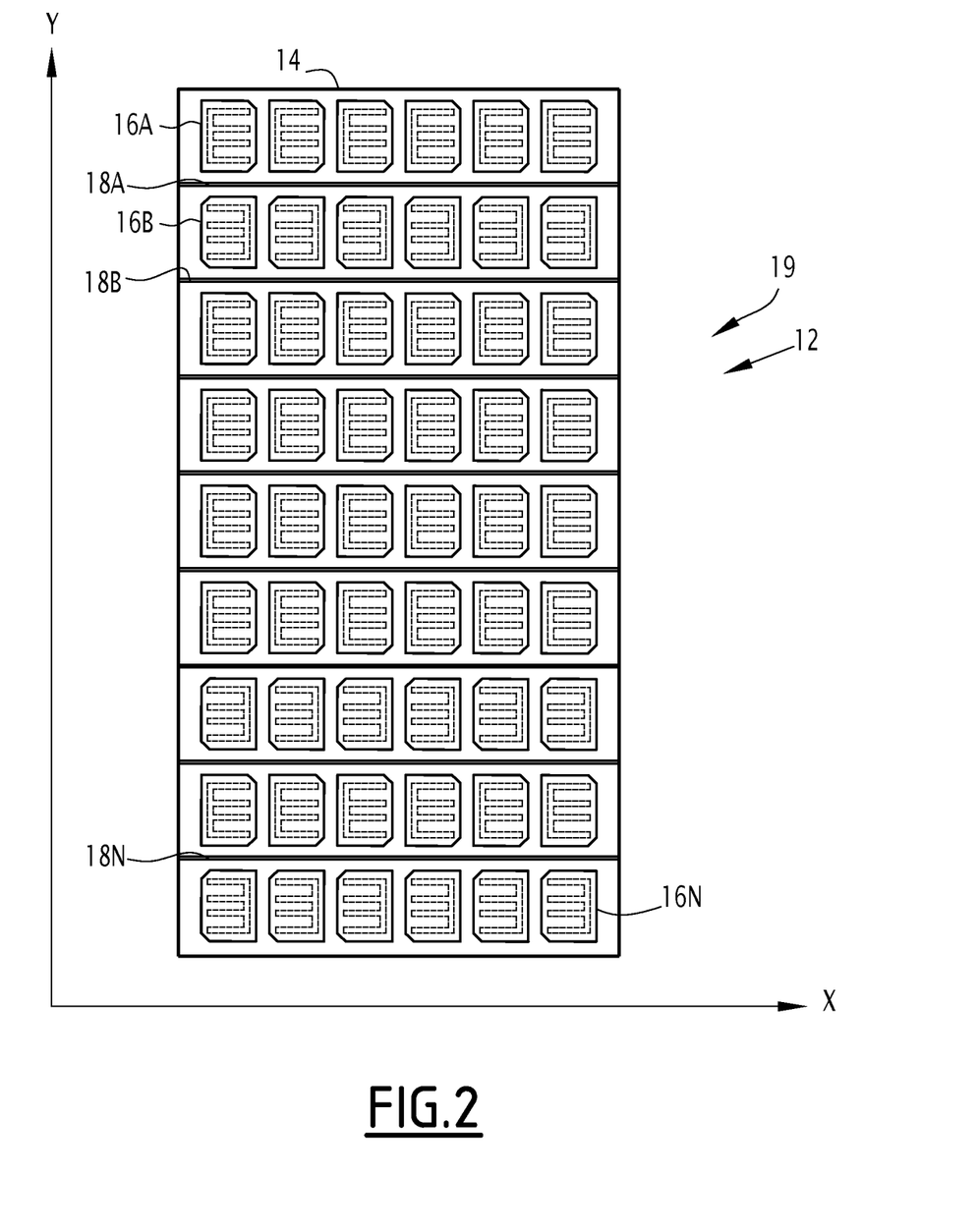
FIG. 2 is a schematic top view of the solar panel of FIG. 1.

As illustrated in FIG. 2, the solar panel 12 for example has an elongate shape along a longitudinal axis Y perpendicular to a transverse axis X. This shape is for example substantially rectangular. In this case, the longitudinal axis Y extends along the length of the rectangle and the transverse axis X extends along the width of this rectangle.

The satellite 10 rotates around the Earth T while following the orbit $O_1$, for example such that the longitudinal axis Y is perpendicular to the plane comprising this orbit $O_1$. In this case, the longitudinal axis Y is called North-South axis.

The solar panel 12 comprises a structure 14, a plurality of photovoltaic cells 16A to 16N able to generate an electric current and arranged on the structure 14 while forming rows along the transverse axis X, and a plurality of dielectric barriers 18A to 18N arranged between the rows of cells 16A to 16N and extending along the transverse axis X, as will be explained hereinafter. Furthermore, the first and last cells of each row are called end cells hereinafter.

The structure 14 is suitable for being fastened to the body 13 of the satellite 10 and has the cabling means necessary to conduct an electrical current between the cells 16A to 16N and toward the body 13 of the satellite 10.

Each cell 16A to 16N is for example able to produce an electrical current of about 0.5 A, or 0.8 A, or even 1.6 A based on the unit size of the solar cells, even larger.

In the example of FIG. 2, the cells 16A to 16N are arranged on the structure 14 in nine rows, each row being made up of six cells and extending along the transverse axis X. In FIG. 2, only the first cells 16A and 16B of the first two rows, the last cell 16N of the last row, the barriers 18A, 18B separating the first three rows from one another and the barrier 18N separating the last row from the next to last row, bear references.

Figure 3:
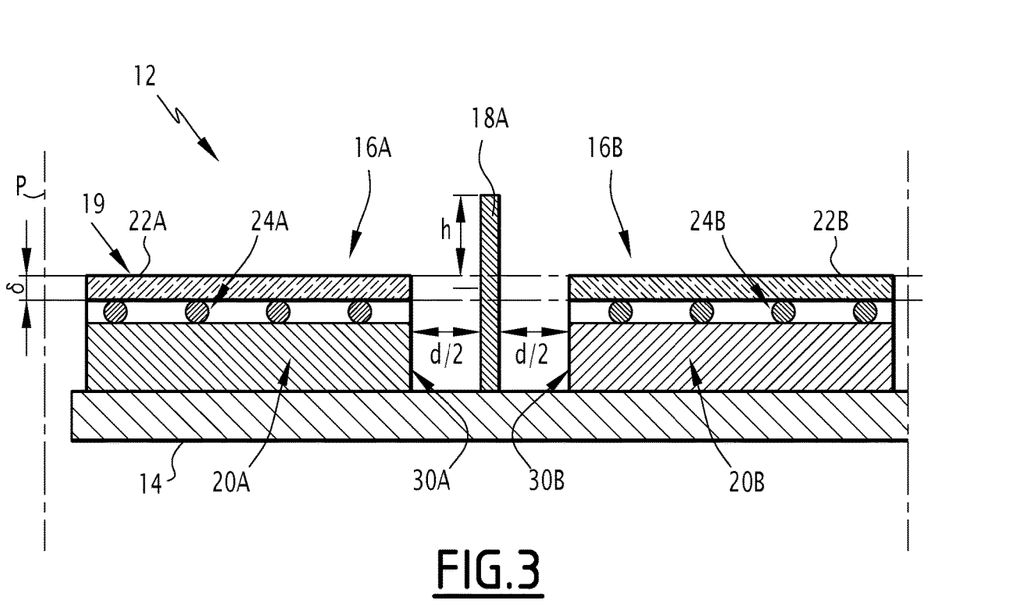
FIG. 3 is a schematic longitudinal sectional view of part of a solar panel of FIG. 1 illustrating the first embodiment of the invention.

The cells 16A to 16N form a panel surface 19 visible in FIG. 3.

The panel surface 19 defines a direction P perpendicular to this surface. The perpendicular direction P moves away from the lighting direction E along a separation angle α. During different phases of the rotation of the satellite 10, the separation angle α varies from 0° up to the value of a maximum separation angle $\alpha_{max}$.

The maximum separation angle $\alpha_{max}$ is for example equal to about 23.45°. Such a value of the separation angle is intended to prevent shadows cast on the panel surface 19.

The cells 16A to 16N are substantially identical to one another. Furthermore, the barriers 18A to 18N separating the rows of cells are also substantially identical to one another.

In particular, seen from above (the view of FIG. 2), each cell 16A to 16N has a hexagonal shape with two right angles adjacent to a same side, called long side, and four other angles greater than 90°, two of these angles being adjacent to a side parallel to the long side, called short side. The shape is symmetrical relative to an axis perpendicular to the short side and the long side.

In other words, seen from above, each cell 16A to 16N assumes the form of a rectangle with two symmetrically canted angles.

In a same row, the cells 16A to 16N are arranged traditionally, i.e., such that their long side (or the short side) is perpendicular to the transverse axis X.

Furthermore, in a same row, the cells 16A to 16N are connected to one another by the cabling means extending parallel to the transverse axis X and traditionally called inter-connectors (not shown in FIG. 2).

Lastly, as is known in itself, between adjacent cells of a same row, the voltage is not very different and is for example comprised between 0.5 V and 2.5 V depending on the technology of the cells.

Between each pair of different rows, the cabling means connect only two adjacent cells, for example the end cells located on the same side of the panel 12.

Thus, in the example of FIG. 2, the cabling means connect the cells of a same row transversely and the cells of different rows longitudinally.

As an example, in FIG. 2, the last cells of the first two rows are connected by the same cabling means. Like in the previous case, the voltage between these adjacent cells is for example comprised between 0.5 V and 2.5 V based on the technology of the cells.

In the example embodiment of FIG. 2, each barrier 18A to 18N extends along the transverse axis X substantially between the end cells of a same row, i.e., along the entire corresponding row. In this case, the cabling means between different rows pass by bypassing the corresponding barrier or below the panel as is done traditionally for each cell row.

However, in the general case, the expense of each barrier 18A to 18N along the corresponding row can be adjusted based on the arrangement of the cells 16A to 16N and the cabling means.

In particular, when the end cells of two adjacent rows are connected by the cabling means, it is not necessary to extend the corresponding barrier 18A to 18N up to these cells given that the voltage between these cells is relatively low (between 0.5 V and 2.5 V).

In general, according to the invention, a barrier 18A to 18N is arranged between each pair of cells 16A to 16N between which the voltage is greater than 30 V.

Particular attention will be given to the locations where, depending on the embodiment, one could have a row end with a high voltage near a loop on a same cell row. The barrier should then protect the cells having a high voltage with a sufficient distance between the cells both at a height and flush. The cabling of the adjacent row should then bypass or traverse the barrier. The barrier may have a notch to be able to be placed after the cabling.

Lastly, when the cells 16A to 16N have more complex shapes (trapezoidal, half-hexagonal or half-octagonal, or the like), the barriers 18A to 18N are no longer straight, but forms zigzags. In this case, the cells 16 to 16N are oriented such that the corresponding barriers 18A to 18N generate the least possible amount of shadow over its greatest possible length.

Subsequently, only the adjacent cells 16A and 16B and the barrier 18A separating these cells 16A, 16B will be explained in more detail in particular in reference to FIG. 3, illustrating part of the solar panel 10 in cross-section.

As illustrated in FIG. 3, each of the cells 16A, 16B includes a base element 20A, 20B fixed on the structure 14, a protective element 22A, 22B covering the base element 20A, 20B, and a grid of electrical conductors 24A, 24B arranged between the base element 20A, 20B and the protective element 22A, 22B.

The base element 20A, 20B is known in itself. Such an element in particular comprises a conductive plate, a lower layer made up of a P-type semiconductor and covering the conductive plate, and an upper layer made up of a N-type semiconductor and covering the lower layer.

The protective element 22A, 22B is made from a transparent material such as glass, and for example, it makes it possible to protect the cell 16A, 16B from the radiative dose while allowing the light to pass toward the base element 20A, 20B. This element 22A, 22B is also known as "coverglass".

The grid 24A, 24B includes a plurality of conductive wires arranged homogeneously over the entire surface of the base element 20A.

In particular, the grid 24A, 24B assumes the form of a comb (visible in FIG. 2) with the conductive wires extending along the transverse axis X. In a manner known in itself, such a structure allows the light to pass toward the base element 20A, 20B.

Each of the two cells 16A, 16B defines a lateral contact face 30A, 30B. The lateral contact faces 30A, 30B are arranged regarding one another. Thus, a conductive wire of each of the grids 24A, 24B runs alongside the corresponding lateral contact face 30A, 30B.

The lateral contact faces 30A, 30B are separated from one another by a distance d.

The barrier 18A is arranged between the lateral contact faces 30A, 30B symmetrically.

The barrier 18A protrudes relative to the panel surface 19. In FIG. 3, reference h corresponds to the length of the protruding part extending in the perpendicular direction P, from the barrier 18A relative to the panel surface 19, and reference δ corresponds to the thickness of the protective elements 22A, 22B. Thus, the barrier 18A protrudes relative to the ends of the grids 24A, 24B in contact with the protective elements 22A, 22B by a value h+δ. This value h+δ is greater than about 10 mm.

Thus, in this example embodiment, the shortest path between the grids 24A and 24B, and in particular between the wires extending along the lateral contact faces 30A, 30B, by bypassing the barrier 18A, is equal to at least about 20 mm.

The barrier 18A is a thin plate fastened on the structure 14 and for example made from glass or from a polyimide polymer, in particular in the form of the material known under the name Kapton® or UPILEX®. However, more generally, the barrier 18A can be made from any dielectric material. Advantageously, it is possible to choose from dielectrics withstanding the temperature well (Polyimide Kapton™, Teflon™, Coverglass of all types, etc.)

Advantageously, the material of the barrier 18A is flexible. In this case, the barrier 18A is suitable for being folded in the space delimited between the two lateral contact faces 30A and 30B without protruding relative to the panel surface 19. Such a configuration of the barrier 18A for example makes it possible to keep it folded when the satellite is launched and stationed, i.e., before deployment of the solar panels 12, 12'.

According to the first embodiment of the invention, the cells 16A and 16B are arranged such that the shade generated by the barrier 18A when the direction perpendicular P to the panel surface 19 moves away from the lighting direction E of the maximum separation angle $\alpha_{max}$, is substantially outside each of the two cells 30A, 30B.

Thus, according to this embodiment, the distance d between the lateral contact faces 30A, 30B of the cells 16A, 16B is for example comprised between 6 mm and 12 mm, preferably between 8 mm and 10 mm, and advantageously equal to about 9 mm.

The barrier 18A is therefore separated from each of the lateral contact faces 30A, 30B by about 4.5 mm.

One can then see that the present invention has a certain number of advantages.

First, it has been demonstrated that when the shortest path between conductive components of the adjacent photovoltaic cells increases, the risk of establishment of an electric arc between these components is greatly decreased.

Thus, a dielectric barrier inserted between two lateral contact faces of cells and protruding from the panel surface makes it possible to extend this path and thereby decrease the risk of establishment of an electric arc.

Furthermore, by choosing the dimensions of the protruding part of this barrier in a particular manner, it is possible to minimize the risk of establishment of an electric arc while retaining a compact arrangement of the cells on the structure.

In particular, it has been demonstrated that the minimal value of the shortest path between the conductive components of the adjacent photovoltaic cells must be about 20 mm. This is the case when the value h+δ is about 10 mm.

According to the first embodiment of the invention, the adjacent cells are separated from one another only so that the barrier does not generate shade cast on the working surface of the cells even when the lighting direction E and the perpendicular direction P form the maximal separation angle $\alpha_{max}$. This then makes it possible to retain the same productivity of the panel according to the invention relative to a conventional panel, irrespective of the position of the satellite.

Lastly, the flexibility of the barriers ensures that the presence of the barriers on the panels does not require any structural change of these panels. Indeed, the solar panels according to the invention can be folded on one another in particular during the launch phase of the satellite, without the barriers hindering this folding.

Figure 4:
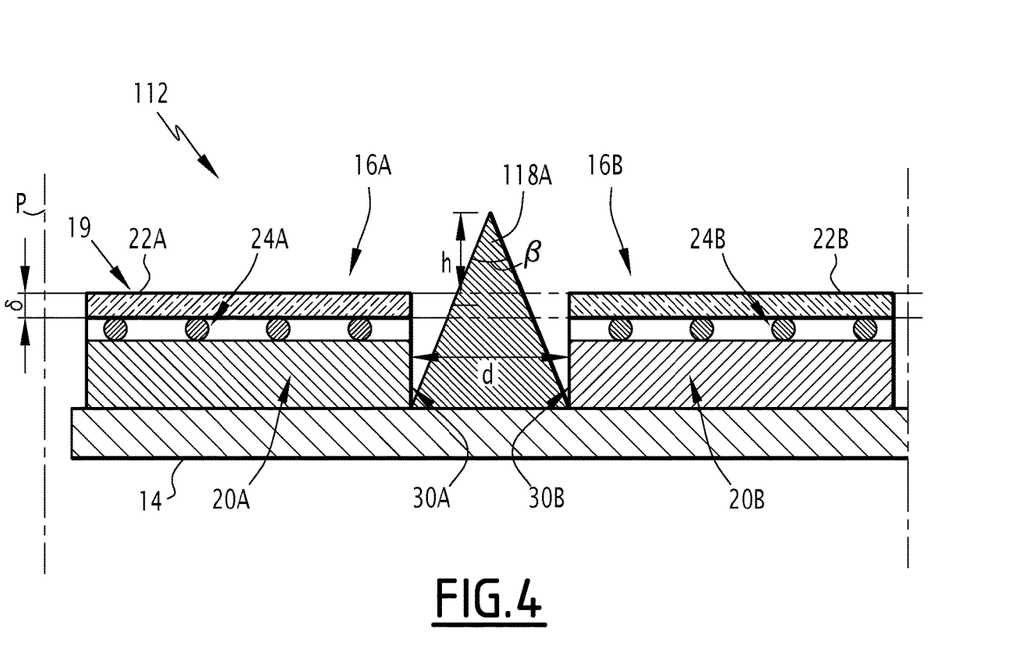
FIG. 4 is a view similar to that of FIG. 3 of a solar panel according to a second embodiment of the invention.

A solar panel 112 according to a second embodiment of the invention is illustrated in FIG. 4.

The solar panel 112 is similar to the solar panel 12 previously described and in particular includes a structure 14 and photovoltaic cells 16A to 16N substantially identical to those previously described.

The solar panel 112 further includes a plurality of barriers 118A to 118N that differ from the barriers 18A to 18N previously described only by their shape in cross-section.

Thus, as illustrated in FIG. 4 in connection with the barrier 118A, each barrier 118A to 118N has a cross-section in the shape of an isosceles triangle.

The length of the base of this triangle is equal to the value of the distance d previously mentioned, the triangle protruding relative to the panel surface 19 by the same value h previously mentioned.

The angle $\beta$ of the triangle regarding the base is equal to about two maximal separating angles $\Delta_{max}$.

Thus, like in the previous case, the barriers 118A to 118N make it possible to minimize the risk of establishment of an electric arc between each adjacent pair of cells and do not generate shade cast on these cells.

Figure 5:
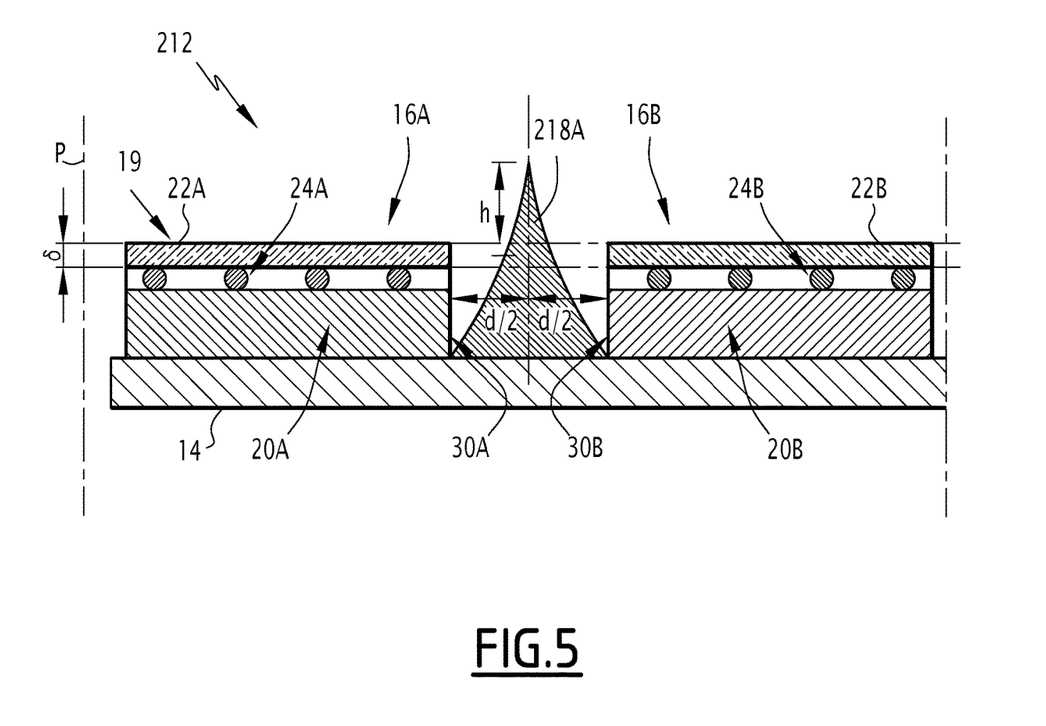
FIG. 5 is a view similar to that of FIG. 3 of a solar panel according to a third embodiment of the invention.

A solar panel 212 according to a third embodiment of the invention is illustrated in FIG. 5.

The solar panel 212 is similar to the solar panel 112 previously described and in particular includes a structure 14 and photovoltaic cells 16A to 16N substantially identical to those previously described.

The solar panel 212 further includes a plurality of barriers 218A to 218N that differ from the barriers 118A to 118N previously described in that each barrier 218A to 218N assumes the form of a concentrator.

Thus, as illustrated in FIG. 5 in connection with the barrier 218A, each barrier 218A to 218N has a cross-section in the shape of a curved isosceles triangle with a straight base.

The length of the base of this triangle is equal to the value of the distance d previously mentioned, the triangle protruding relative to the panel surface 19 by the same value h previously mentioned.

The angle $\beta$ of the triangle regarding the base is equal to about two maximal separating angles $\Delta_{max}$.

The surface of the barriers 218A to 218N exposed to the rays of the Sun S is covered by a reflective material. The shape of the curved faces of the barriers 218A to 218N is suitable for reflecting the rays toward the corresponding cells.

Like in the previous cases, the barriers 218A to 218N make it possible to minimize the risk of establishment of an electric arc between each adjacent pair of cells and do not generate shade cast on these cells.

Furthermore, according to this embodiment, the productivity of the solar panel 213 is improved owing to the barriers 218A to 218N assuming the form of concentrators.

Figure 6:
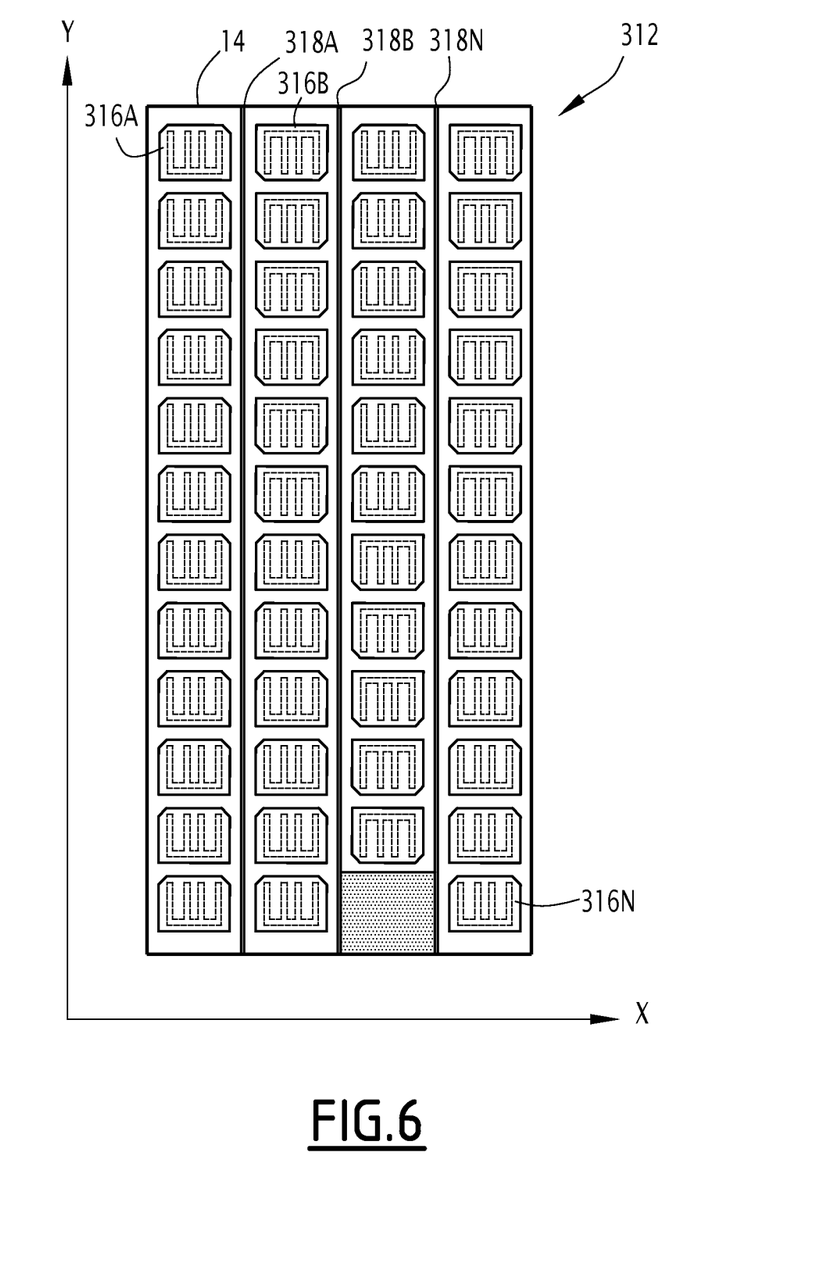
FIG. 6 is a view similar to that of FIG. 2 of a solar panel according to a fourth embodiment of the invention.

A solar panel 312 according to a fourth embodiment of the invention is illustrated in FIG. 6.

The solar panel 312 is similar to the solar panel 12 previously described and in particular includes a structure 14.

The solar panel 312 further includes a plurality of photovoltaic cells 316A to 316N arranged on the structure 14 while forming rows along the longitudinal axis Y and a plurality of barriers 318A to 318N arranged between the rows of cells 316A to 316N. Like in the previous case, the first and last cells of each row are called end cells hereinafter.

The solar panel 312 differs from the panels previously described solely by the arrangement of the cells 316A to 316N on the structure 14.

In particular, according to this embodiment, the cells 316A to 316N are arranged on the structure 14 in four rows, each row being made up of no more than twelve cells and extending along the longitudinal axis Y. In FIG. 6, only the first cells 316A and 316B of the first rows and the last cell 316N of the last row bear references.

Furthermore, according to this embodiment, in a same row, the cells 316A to 316N are connected to one another by the cabling means extending parallel to the longitudinal axis Y.

Like in the previous case, between adjacent cells of a same row, the voltage is not very different and is for example comprised between 0.5 V and 2.5 V depending on the technology of the cells.

Between each pair of different rows, the cabling means connect the corresponding cells, and preferably end cells, while bypassing the corresponding barrier 318A to 318N.

In the example of FIG. 6, the barriers 318A to 318N extend all along the corresponding rows. However, like in the previous case, the expanse of the barriers 318A to 318N can be shortened in the locations where the cabling means connect two cells of the different rows in light of a relatively low voltage between these cells.

However, according to the invention, a barrier 318A to 318N is arranged between each pair of cells 316A to 316N between which the voltage is greater than 30 V.

Each barrier 318A to 318B is similar to one of the barriers 18A, 118A or 218A previously described.

Like in the previous cases, each barrier 318A to 318N protrudes relative to the panel surface 19 by the same value h previously mentioned, to minimize the risk of an electric arc being established.

The arrangement of the barriers 318A to 318N along the longitudinal axis Y constitutes a particular advantage of the invention according to the fourth embodiment. Indeed, such an arrangement of the barriers 318A to 318N relative to the Sun S causes the barriers 318A to 318N not to generate shade cast on the cells.

Thus, the distance d between the lateral contact faces of each pair of cells 316A to 316N belonging to the different rows can advantageously be reduced in order to make the arrangement of these cells on the structure 14 more compact.

According to this embodiment, this distance d is for example equal to 0.9+/−0.3 mm.

Furthermore, unlike the arrangement of these cells illustrated in FIG. 2, there is no longer a need to separate the cells along the longitudinal axis Y. Thus, the cells in FIG. 6 are arranged on the structure 14 particularly compactly, in particular along the longitudinal axis Y and without modifying the typical dimensions of a solar panel without barriers.

Of course, other embodiments of the invention are also possible.

In particular, it is possible to combine at least some of the embodiments previously described in order to obtain a solar panel including at least one barrier minimizing the risk of an electric arc being established between two adjacent cells without generating shade cast on these cells.

The barrier can be continuous or discontinuous when the voltage drops again below 30 V or to facilitate a folding mode when the gap between cells is not straight due to the shape of the cells (for example, trapezoidal).

The dielectric barrier can be made from a shape memory material, to regain the desired shape after deployment or lighting (by energy transmission).

Furthermore, it must be understood that the solar panel according to the invention can be on board any moving vehicle other than a satellite, or in general can be used independently of any moving vehicle, for example in a stationary configuration on a land surface.

Preferably, in all embodiments of the invention, the distance d between the lateral contact faces of each pair of neighboring cells is less than each dimension of these cells (width, length and height), advantageously is two times less than each of these dimensions. Further, preferably, this distance d is less than 30 mm, advantageously less than 20 mm and more advantageously less than 10 mm.

The invention claimed is:

1. A solar panel, including:
a structure in contact with an ambient environment;
at least two photovoltaic cells, each cell defining a lateral contact face and including a base element, a grid of electric conductors and a protective element made from transparent material in contact with the ambient environment, the grid being arranged between the protective element and the base element, and wherein the grid of electric conductors of each cell includes at least one conductive wire extending within a length of the lateral contact face of the cell;
the two cells being arranged on the structure such that at least part of each of the lateral contact faces is arranged facing each other and such that the protective element of each of the two cells form a panel surface;
wherein the cells are arranged such that the shortest path running through the ambient environment between the at least part of the lateral contact faces of the two cells is equal to at least about 20 mm, and
wherein a barrier made from dielectric material arranged on the structure between the lateral contact faces of the two photovoltaic cells, extending along the at least parts of the lateral contact faces facing each other and protruding relative to the panel surface, the shortest path between the at least parts of the lateral contact faces facing each other being calculated by going around the barrier.

2. The panel according to claim 1, wherein:
it is designed to operate in an environment in which a direction perpendicular to the panel surface and a lighting direction form a maximum separation angle smaller than 90°, the lighting direction being defined by a straight line passing through the center of a lighting source and a predetermined point of the panel; and
the barrier and/or the cells are arranged such that a shade generated by the barrier, when the angle between the direction perpendicular to the panel surface and the lighting direction is equal to the maximum separation angle, is substantially outside each of the two cells.

3. The panel according to claim 1, being on board a spacecraft.

4. The panel according to claim 1, wherein the barrier protrudes relative to the panel surface by at least about 10 mm.

5. The panel according to claim 1, wherein the the lateral contact faces of the two cells are separated by at least about 9 mm.

6. The panel according to claim 2, wherein a cross-section of the barrier forms an isosceles triangle, wherein a base of the isosceles triangle is adjacent to the structure, and wherein an angle opposite the base being twice the maximum separation angle.

7. The panel according to claim 1, wherein:
the structure has an elongated shape along a longitudinal axis perpendicular to a transverse axis; and
the grid of each cell includes a plurality of conductive wires extending along the longitudinal axis.

8. The panel according to claim 7, wherein the grid of each cell assumes the form of a comb, wherein the teeth of the comb are formed by conductive wires extending along the longitudinal axis.

9. The panel according to claim 7, being on board a spacecraft rotating around an orbit, wherein the longitudinal axis is perpendicular to a plane comprising the orbit.

10. The panel according to claim 1, wherein the barrier is made from a flexible material, the barrier being suitable for being folded in the space delimited by the two lateral contact faces without protruding relative to the panel surface.

11. The panel according to claim 1, wherein the barrier is made from a polyimide polymer.

12. The panel according to claim 1, wherein the barrier is a concentrator.

13. The panel according to claim 1, wherein the barrier is arranged between each of the at least two photovoltaic cells between which the voltage is greater than 30 V.

14. The panel according to claim 1, wherein the grid of electric conductors is electrically isolated from each remaining cell of the at least two cells.

15. A solar panel comprising:
a structure;
at least two photovoltaic cells; and
a barrier, wherein:
each of the at least two photovoltaic cells defines a lateral contact face extending in a longitudinal axis,
each of the at least two photovoltaic cells includes a base element, a grid of electric conductors, and a protective element made from a transparent material,
each of the grid of electrical conductors includes at least one conductive wire extending within a length of the lateral contact face of the photovoltaic cell and extending only on one surface of the base element,
the at least two photovoltaic cells are arranged on the structure such that at least part of each of the lateral contact faces are facing each other and such that the protective elements of these cells form a panel surface,
the at least two photovoltaic cells are arranged such that the shortest path running through an ambient environment between the at least part of the lateral contact faces of the two cells is equal to at least 20 mm,
the barrier is made from a dielectric material,
the barrier is arranged on the structure between the lateral contact faces of the at least two photovoltaic cells.

* * * * *